(12) United States Patent
Aal (10) Patent No.: US 12,153,091 B2
(45) Date of Patent: Nov. 26, 2024

(54) METHOD, A DEVICE AND A COMPUTER PROGRAM FOR OPERATING A MODULAR TEST BENCH COMPRISING AT LEAST ONE TEST BENCH CIRCUIT TO TEST A TEST OBJECT

(71) Applicant: Volkswagen Aktiengesellschaft, Wolfsburg (DE)

(72) Inventor: Andreas Aal, Braunschweig (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 95 days.

(21) Appl. No.: 17/785,629

(22) PCT Filed: Dec. 11, 2020

(86) PCT No.: PCT/EP2020/085761
§ 371 (c)(1),
(2) Date: Jun. 15, 2022

(87) PCT Pub. No.: WO2021/122374
PCT Pub. Date: Jun. 24, 2021

(65) Prior Publication Data
US 2023/0047570 A1 Feb. 16, 2023

(30) Foreign Application Priority Data
Dec. 18, 2019 (EP) .................... 19217543

(51) Int. Cl.
*G01R 31/3183* (2006.01)
*G01R 31/28* (2006.01)
*G01R 31/317* (2006.01)

(52) U.S. Cl.
CPC . *G01R 31/318314* (2013.01); *G01R 31/2884* (2013.01); *G01R 31/31713* (2013.01)

(58) Field of Classification Search
CPC ........ G01R 31/318314; G01R 31/2884; G01R 31/31713; G05B 17/02; G01M 17/007
See application file for complete search history.

(56) References Cited

U.S. PATENT DOCUMENTS

| | | | |
|---|---|---|---|
| 6,513,143 B1 * | 1/2003 | Bloom | G06F 30/33 |
| | | | 702/117 |
| 11,016,471 B2 | 5/2021 | Stichling et al. | |

(Continued)

FOREIGN PATENT DOCUMENTS

| | | | |
|---|---|---|---|
| CN | 104536856 A | 4/2015 | G05B 23/02 |
| CN | 107480042 A | 12/2017 | G06F 11/36 |

(Continued)

OTHER PUBLICATIONS

Extended European Search Report, Application No. 19217543.8, 7 pages, Jun. 17, 2020.

(Continued)

*Primary Examiner* — April Y Blair
*Assistant Examiner* — Rong Tang
(74) *Attorney, Agent, or Firm* — Slayden Grubert Beard PLLC (57) ABSTRACT

An embodiment of a method for operating a modular test bench is disclosed, wherein the modular test bench comprises at least one test module to test a test object. The method comprises receiving first information on a hardware revision and on a software revision of the test module and receiving second information on a hardware revision and on a software revision of the test object. The method further comprises determining, if the combination of the first information and the second information fulfills a predetermined criterion and outputting a check signal, enabling the use of the test bench if the combination of the first information and the second information fulfills the predetermined criterion.

15 Claims, 3 Drawing Sheets

(56) References Cited

U.S. PATENT DOCUMENTS

| | | | |
|---|---|---|---|
| 2006/0277510 A1* | 12/2006 | Sasaki | G06F 30/33 703/16 |
| 2010/0250220 A1 | 9/2010 | Colmenares | 703/13 |
| 2010/0305926 A1 | 12/2010 | Canedo et al. | 703/8 |
| 2014/0244231 A1 | 8/2014 | Paule et al. | 703/13 |
| 2016/0305853 A1 | 10/2016 | Senf | 702/113 |
| 2017/0315521 A1 | 11/2017 | Hagendorf | |
| 2021/0190633 A1* | 6/2021 | Signor | G01M 13/025 |
| 2022/0147337 A1* | 5/2022 | Michelsohn | G06F 11/1433 |

FOREIGN PATENT DOCUMENTS

| | | | |
|---|---|---|---|
| CN | 108897240 A | 11/2018 | G05B 17/02 |
| CN | 109240271 A | 1/2019 | G05B 23/02 |
| CN | 110502430 * | 11/2019 | G05B 17/02 |
| CN | 110502430 A | 11/2019 | G06F 11/36 |
| DE | 102012221367 A1 | 5/2014 | G01M 17/007 |
| DE | 102015115855 A1 | 3/2017 | G06F 9/445 |
| DE | 102017127400 A1 | 5/2019 | G06F 16/00 |
| EP | 3839667 A1 | 6/2021 | G05B 17/02 |
| JP | 2011018173 A | 1/2011 | G06F 11/28 |
| WO | 2021/122374 A1 | 6/2021 | G05B 17/02 |

OTHER PUBLICATIONS

International Search Report and Written Opinion, Application No. PCT/EP2020/085761, 12 pages, Mar. 9, 2021.

* cited by examiner

FIG. 3

METHOD, A DEVICE AND A COMPUTER PROGRAM FOR OPERATING A MODULAR TEST BENCH COMPRISING AT LEAST ONE TEST BENCH CIRCUIT TO TEST A TEST OBJECT

CROSS-REFERENCE TO RELATED APPLICATIONS

This application claims priority to European Patent Application No. EP 19217543.8, filed on Dec. 18, 2019 with the European Patent Office. The contents of the aforesaid Patent Application are incorporated herein for all purposes.

TECHNICAL FIELD

The invention relates to a method, a device and a computer program for operating a modular test bench comprising at least one test bench circuit to test a test object.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Manufacturing mechatronic systems is a complex process wherein several electronic components are interconnected with each other. It is essential that not only each electronic component operates reliable in isolation but also that the components interoperate flawlessly and without error since the mechatronic system as a whole should proof to provide a certain standard for a user, e.g., in terms of reliability, safety and cyber security. Especially in automotive engineering, a large number of mechatronic systems composed of multiple objects are tested in detail. Test execution is often initiated by test benches composed of modular hardware that performs a test or that runs a test scenario which is specific for a test object, i.e., an object to be tested. As an example, a test object might be a parking assist system or a cruise control of a vehicle. Modularity of the test bench may be beneficial in that the test bench may be upgraded to support future test objects or in that not every possible test object needs to be supported by every test bench.

However, in practice it is often observed that test results of particular combinations of test benches and test objects are affected by errors. The reason for the occurrence of errors can be of different origins and is frequently not understood.

Beside the typical error of a functional defect of the mechatronic system itself, there exists also a so-called pseudo error due to an incompatible combination between the test bench and the test object. It has been observed that pseudo errors even occur if the hardware of the test bench is principally capable to test the object to be tested, which is also called the device under test.

SUMMARY

A need exists to improve interoperability between test benches and the objects to be tested. The need is addressed by the subject matter of any of the independent claims.

Embodiments of the invention are described in the dependent claims, the following description, and the drawings.

DESCRIPTION

The details of one or more embodiments are set forth in the accompanying drawings and the description below. Other features will be apparent from the description, drawings, and from the claims.

In the following description of embodiments of the invention, specific details are described in order to provide a thorough understanding of the invention. However, it will be apparent to one of ordinary skill in the art that the invention may be practiced without these specific details. In other instances, well-known features have not been described in detail to avoid unnecessarily complicating the instant description.

Some embodiments of a method for operating a modular test bench wherein the test bench comprises at least one test module to test a test object, comprise receiving a first information on a hardware revision and on a software revision of the test module and also receiving a second information on a hardware revision and on a software revision of the test object. The method further determines, if the combination of the first information and the second information fulfills a predetermined criterion. Further, the method comprises outputting a check signal, enabling the use of the test bench if the combination of the first information and the second information fulfills the predetermined criterion. Also including the software revisions of the test bench and of the test object into an evaluation of compatibility, multiple additional sources of incompatibility are considered, and the number of pseudo errors may be decreased. Hence, the combination can be enabled to interoperate by means of the check signal since it is assured that the interoperation does not generate an unreliable test result. The check signal so distinguishes between approved and non-approved test benches for a particular test object to be tested.

As known in the industry, a test module may also be denoted a test bench circuit. A (modular) test bench circuit is hardware that is designed to fit mechanically and/or electrically into one of the multiple slots or boxes of the test bench. The test bench and the test bench circuits are interoperable and capable to communicate with one another according to a common standard. A test bench circuit may comprise hardware designed to perform tests of one or more test objects/systems external to the test bench (also referred to as 'device under test' or short 'DUT').

In some embodiments, the predetermined criterion of the method for operating a modular test bench is fulfilled if the combination of the first information and the second information is present in a dataset comprising interoperable combinations between hardware revisions and software revisions of the test module and hardware revisions and software revisions of the test object. The predetermined criterion is used to determine if the test module is able to interoperate flawlessly with a test object. Depending on the presence of compatible combinations of test modules and test objects in the dataset, the method outputs a check signal which approves the test module to test the test object. Using a dataset may allow to keep track of arbitrarily high numbers of combinations of hardware and software revisions. Further, a dataset may be distributed amongst different test bench locations to easily increase device interoperability of multiple test benches.

In some embodiments, the method for operating the modular test bench further comprises storing the dataset. By storing the dataset comprising the first information and the second information, interoperable or approved combinations between test modules and test objects are accessible for more than a temporary time period. A user may be able to edit the dataset at any time such as if a new software revision of a test object is present so that the stored dataset can be updated by new compatible combinations based on the added software revision of the test object.

In some embodiments, the method for operating the modular test bench further comprises receiving and transmitting interoperable combinations of first information and second information from and to an external entity. The method allows to obtain information regarding compatible hardware and software revision which, e.g., might have been collected in advance in an external entity. By transmitting data to an external entity, information regarding compatible combinations between test modules and test benches, may be collected and accessible globally. Data administration allows also to keep the collected data up to date for all test benches connecting to the external entity by adding new compatible combinations or deleting obsolete data.

In some embodiments, the method further comprises receiving information on a revision of a data interface between the test bench and the test object, and information on a test event. The method further comprises determining, if the combination of the revision of the data interface and the information on a test event fulfills a further predetermined criterion. Further, the method comprises outputting the check signal enabling the use of the test bench if the revision of the data interface and the information on a test event fulfills the further predetermined criterion. The number of pseudo errors may be additionally decreased by considering also revisions of the data interface and test events to, for example, assure that the interface is able to transmit the data associated to the test event. Hence, pseudo errors may be avoided as test benches are able to map test events to the corresponding test objects properly.

In some embodiments, the method for operating the modular test bench further comprises outputting the check signal inhibiting the use of the test bench if the combination of the first information and the second information does not fulfill the predetermined criterion. By this means invalid test executions based on incompatible or unapproved combinations of test modules and test objects may be avoided as with the inhibiting check signal the test bench is not allowed to interoperate with the test object. Even if a user of the test bench who is unaware of the incompatibility or of the fact that the combination has not been approved in advance, an undesired use may so be inhibited.

Some embodiments of a device for a modular test bench wherein the modular test bench comprises at least one test module to test a test object, comprise an input interface configured to receive first information on a hardware revision and on a software revision of the test module and to receive second information on a hardware revision and on a software revision of the test object. Further, an evaluation logic is configured to determine if the combination of the first information and the second information fulfills a predetermined criterion. Further, an output interface is configured to output a check signal enabling the use of the test bench if the combination of the first information and the second information fulfills the predetermined criterion. Also including the software revisions of the test bench and of the test object into an evaluation of compatibility, multiple additional sources of incompatibility are considered, and the number of pseudo errors may be decreased. Hence, the combination can be enabled to interoperate by means of the check signal since it is assured that the interoperation does not generate an unreliable test result. The check signal so distinguishes between approved and non-approved test benches for a particular test object to be tested.

In some embodiments, the predetermined criterion of the device for the modular test bench is fulfilled if the combination of the first information and the second information is present in a dataset comprising interoperable combinations between hardware revisions and software revisions of the test module and hardware revisions and software revisions of the test object. The predetermined criterion is used to determine if the test module is able to interoperate flawlessly with a test object. Depending on the presence of compatible combinations of test modules and test objects in the dataset, the method outputs a check signal which approves the test module to test the test object. Using a dataset may allow to keep track of arbitrarily high numbers of combinations of hardware and software revisions. Further, a dataset may be distributed amongst different test bench locations to easily increase device interoperability of multiple test benches, In some embodiments, the device for the modular test bench further comprises a memory having stored therein the dataset. By storing the dataset comprising the first information and the second information, interoperable or approved combinations between test modules and test objects are accessible for more than a temporary time period. A user may be able to edit the dataset at any time such as if a new software revision of a test object is present so that compatible combinations based on the new software revision can be added to the existing dataset.

In some embodiments, the device for the modular test bench further comprises a management interface configured to receive and transmit interoperable combinations of first information and second information from and to an external entity. The management interface allows to obtain information regarding compatible hardware and software revision which, e.g., might have been collected in advance in an external entity. By transmitting data to an external entity, information regarding compatible combinations between test modules and test benches, may be collected and accessible globally. Data administration allows also to keep the collected data up to date for all test benches connecting to the external entity by adding new compatible combinations or deleting obsolete data.

In some embodiments, the input interface of the device for the modular test bench is further configured to receive information on a revision of a data interface between the test bench and the test object and information on a test event. The evaluation logic is further configured to determine if the combination of the revision of the data interface and the information on a test event fulfills a further predetermined criterion. Further, the output interface is configured to output the check signal enabling the use of the test bench if the revision of the data interface and the information on a test event fulfills the further predetermined criterion. The number of pseudo errors may be additionally decreased by also considering revisions of the data interface and test events to, for example, assure that the interface is able to transmit the data associated to the test event. Hence, pseudo errors may be avoided as test benches are able to map test events to the corresponding test objects properly.

In some embodiments, the output interface of the device for the modular test bench, is further configured to output a check signal inhibiting the use of the test bench if the combination of the first information and the second information do not fulfill the predetermined criterion. By this means invalid test executions based on incompatible or unapproved combinations of test modules and test objects may be avoided as with the inhibiting check signal the test bench is not allowed to interoperate with the test object. Even if a user of the test bench who is unaware of the incompatibility or of the fact that the combination has not been approved in advance, an undesired use may so be inhibited. Some embodiments of a modular test bench comprising the prescribed device further comprise a data interface configured to connect to and transfer data to the test object. The device is implemented in the modular test bench directly so that compatibility of the test bench with respect to the test object can be determined and communicated without using an extra apparatus. The test bench may receive the second information of the test object directly via the implemented device so that the incompatibility between the test bench and the test object can be determined instantly. Hence, the test bench is approved or inhibited by the inherent check signal for testing the test object.

In some embodiments, the data interface of the modular test bench is configured to connect to a vehicle. The vehicle is an example of a mechatronic system comprising complex electronic components each to be tested by test benches. By connecting the data interface with the vehicle, test scenarios can be sent to the test objects to check the function of each component of the vehicle.

Some embodiments of a computer program having program code for, when executed on a programmable processor, perform a method according to the previously described method for operating a modular test bench wherein the test bench comprises at least one test module to test a test object. The computer program provides a program code with the prescribed method which can be implemented in a software of an arbitrary apparatus. By way of example, the arbitrary apparatus may be a test bench, a test object or an equipment for an external device. By this means, the user has the flexibility to implement the software with the prescribed method, e.g., only for advanced test benches simulating complex test scenarios such as virtual testing of test objects which have been previously checked by simple test executions.

Some further examples of methods and/or devices will be described in the following by way of example only, and with reference to the accompanying FIGS.

Various examples will now be described more fully with reference to the accompanying drawings in which some examples are illustrated. In the FIGS., the thicknesses of lines, layers and/or regions may be exaggerated for clarity.

Accordingly, while further examples are capable of various modifications and alternative forms, some particular examples thereof are shown in the FIGS. and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the FIGS., which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e., only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
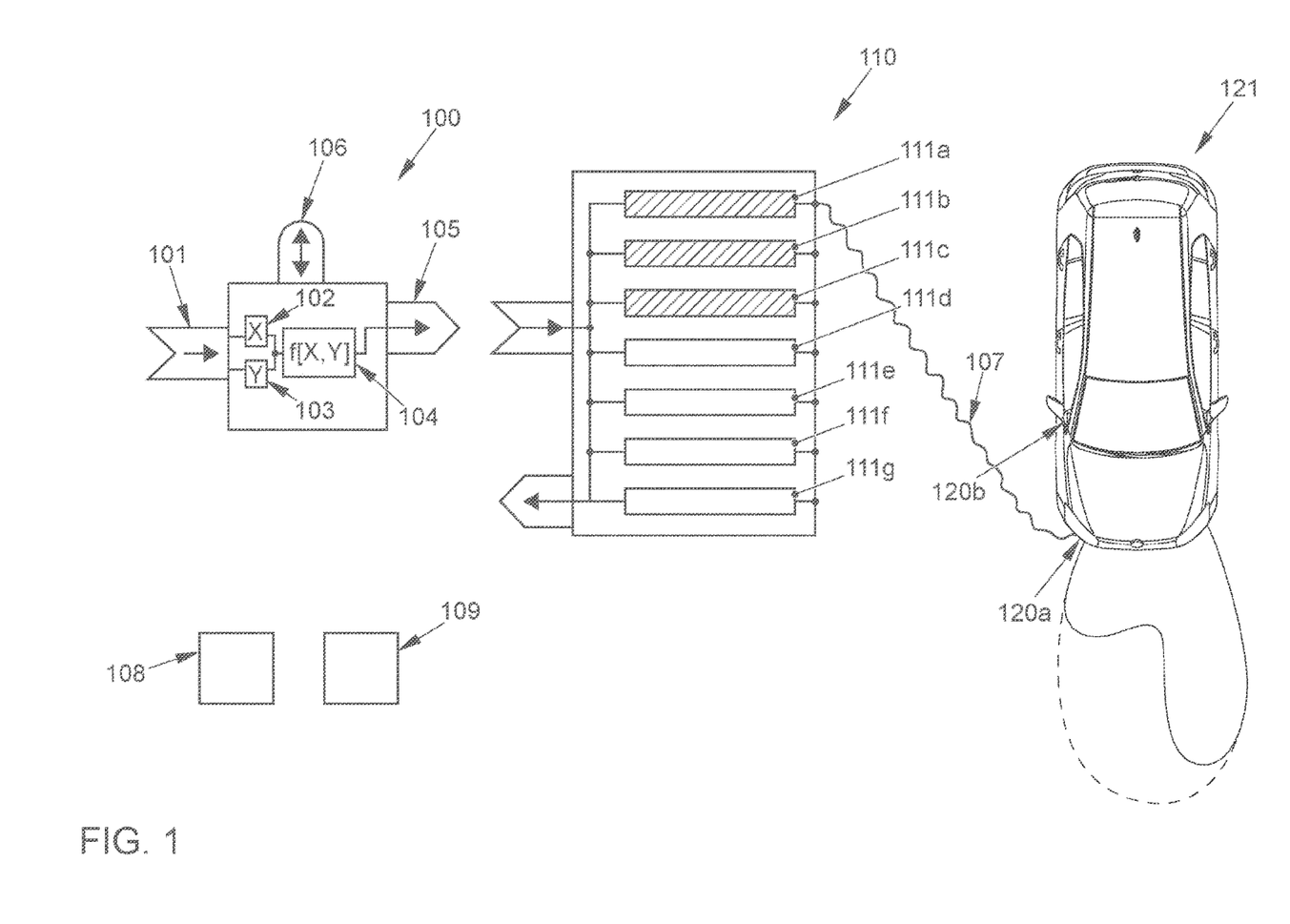
FIG. 1 illustrates an embodiment of a device for a modular test bench wherein a modular test bench comprises at least one test bench circuit and a test object.

FIG. 1 illustrates an embodiment of a device 100 for a modular test bench 110 wherein the modular test bench 110 is composed of at least one test module 111a-111c testing a test object 120a or 120b. The modularity of the test bench 110 is visualized by multiple slots or boxes which can comprise test modules 111a-111c, shown as hatched lines or which can be empty, shown as non-filled boxes 111d-111g.

In this embodiment, the test objects 120a and 120b are sub-systems of a vehicle 121 though any other mechatronic system can be considered equally. To test the test objects 120a and 120b for their functionality the test bench 110 with test modules 111a-111c is used. Individual modules of the test bench may serve to communicate with and test one particular test object 120a or 120b, e.g., a parking assist system, or they may serve to communicate with a group of test objects 120a and 120b to enable the test bench 110 to test all objects 120a and 120b within a group. The compatibility between the test modules 111a-111c of the test bench 110 and the test object 120a or 120b may depend on the hardware and software revision of each test module 111a-111c, subsequently called first information 102, and on the hardware and software revision of the test object 120a or 120b, subsequently called second information 103. The compatibility between the test modules 111a-111c of the test bench 110 and test object 120a or 120b can be checked by an embodiment of a device 100. The device processes the first information 102 and the second information 103 and outputs a check signal enabling the use of the test bench 110 if an interoperable combination between test object 120a or 120b and test module 111a-111c is already approved. Approval may be assumed if the combination of the first information 102 and the second information 103 fulfill a predetermined criterion. In some examples, the device 100 may have access to a dataset which comprises interoperable combinations between hardware revisions and software revisions of the test module and hardware revisions and software revisions of the test object 120a or 120b and the predetermined criterion is fulfilled if the combination of the first information 102 and the second information 103 is already present in the dataset.

In this exemplary case compatibility of the test modules 111a-111c might be checked by the device 100 which then enables the modular test bench 110 to connect and transfer data to the corresponding test object 120a or 120b for test execution. Thus, the number of errors caused by incompatible combinations between test modules 111a-111c and test objects 120a and 120b are reduced since the test bench 110 is unable to perform tests of a test object 120a or 120b that is not yet approved to be compatible. As a result, time and cost consuming processes generated by redundant test executions may be avoided.

In the illustrated example, the device 100 is shown schematically to comprise an input interface 101 configured to receive the first information 102, denoted by a symbol X in FIG. 1. The first information 102 comprises the hardware revision and the software revision of one or all test modules 111a- 111c. The input interface 101 is further configured to receive the second information 103, denoted by a symbol Y, the second information 103 comprising the hardware revision and the software revision of the test object 120a or 120b. The first information 102 of a test module 111a-111c and the second information 103 of the test object 120a or 120b are processed by an evaluation logic 104 of the device 100. Exemplary, processing of the first information 102 and the second information 103 is represented by the function f[X,Y] depending on the parameters first information 102 and second information 103. The evaluation logic 104 is configured to determine if the combination of the first information 102 and the second information 103 fulfills a predetermined criterion. If the predetermined criterion is fulfilled by the combination of the first information 102 and second information 103, the evaluation logic 104 outputs the check signal enabling the use of the test bench 110 via an output interface 105. The check signal may enable the complete test bench 110 to operate or, alternatively, only individual test modules 111a-111c of the modular test bench 110 to operate.

The vehicle 121 in FIG. 1 is demonstrated as an example for a mechatronic system comprising diverse technical components separately produced and subsequently combined to a complex end product. Multiple components having multiple hardware and software revisions are joined to an individual mechatronic system with defined specifications. Each component may correspond to a test object 120a and 120b, which is to be tested for its functionality. The presence of individual test objects 120a and 120b may yield to the demand of different test benches 110 or of dedicated modules to be present in a modular test bench. Using embodiments of devices 100, a large variety of possible combinations between test objects 120a and 120b and test benches 210 can be considered to distinguish between approved and non-approved combinations of test benches and test objects.

For a better understanding of the function of the device 100, a concrete example is discussed in the following but does not restrict the service and capability of the device 100 to this embodiment. According to the embodiment in FIG. 1 an example for a test object might be adaptive lightening 120a of the vehicle 121 to be tested by test events generated by test modules 111a-111c. To test the functionality of adaptive lightening 120a of the vehicle 121, test bench 110 may be exemplarily provided which in general is suitable to test headlights of any type such as adaptive or conventional headlights. To this end, a modular test bench 110 may comprise three test modules 111a-111c available to test headlights principally. The device 100 may serve as a tool to identify which out of the three test modules 111a-111c might be reasonable to test the adaptive lightening 120a. Via the input interface 101 the device 100 receives the first information 102 on a hardware revision and on a software revision of the test modules 111a-111c and second information 103 on a hardware revision and on a software revision of the adaptive lightening 120a. The implemented evaluation logic 104 of the device 100 determines if the combination of the first information 102 of each test module 111a-111c and the second information 103 of the adaptive lightening 120a is present in a dataset.

The dataset comprises interoperable combinations between hardware revisions and software revisions of test modules 111a-111c and hardware revisions and software revisions of the test object 120a. The embodiment of the device 100 may further comprise a memory 108 having stored therein the dataset. By way of example, the memory 108 might be any manual or electronic data consolidation which is available, retrievable, downloadable, callable and much more such as it may be present on a server, on a storage, in a list, a chart, an excel sheet, an electronic document, a data program, an online or offline document and much else. The dataset can be also accessible via oral communication, reporting, dictation and much else. The dataset may optionally further include information about inherent type of hardware and software, about type of interfaces, inherent drivers, updates, upgrades and much more.

According to the embodiment in FIG. 1, the output interface 105 of the device 100 outputs a check signal enabling the use of test module 111b for the adaptive lightening 120a. Further, the output interface 105 of the device 100 is configured to output a check signal inhibiting the use of the test bench 110 if the combination of the first information 102 and the second information 103 do not fulfill the predetermined criterion. In the illustrated example, inhibiting check signals for the test modules 111a and 111c are outputted by the device 100 as the combination of the first information 102 of each test module 111a and 111c and the second information 103 of the adaptive lightening 120a of the vehicle 121 are not in the dataset. By way of example, this may occur as the test module 111a or 111c operates with an obsolete software for usual headlights whereas the software of adaptive lightening is in its latest version. Another example for incompatibility may concern the interfaces between test module 111a or 111c and test object 120a as they are not of the same technical type or level. Thus, test module 111b is identified as compatible by the device 100 for testing the test object 120a efficiently. Residual test modules 111a and 111c are inhibited as test events are not mappable to the test object 120a and are expected to cause an error.

The embodiment of the device 100 further comprises a management interface 106 configured to receive and transmit interoperable combinations of first information 102 and second information 103 from and to an external entity 109. The management interface 106 may serve to receive information referring to predetermined criteria given in an external dataset. Criteria received by the management interface 106 may determine the type of outputted check signal depending on the operation of the evaluation logic 104. In the illustrated example the management interface 106 receives all compatible combinations of test modules and corresponding test objects, which is in our example the test module 111*b* as the test modules 111*a* and 111*c* have been inhibited for testing the adaptive lightening 120*a* of the vehicle 121. This information transferred via the management interface 106 prompts the evaluation logic 104 to send a check signal for the test module 111*b* enabling a test execution with test object 120*a*.

Furthermore, the management interface 106 is configured to transfer data to an arbitrary external entity 109. In the demonstrated example the management interface 106 may transfer data containing information about interoperable combinations of test modules and test objects to an external server. By way of example, the information of the compatible combination of test module 111*b* and adaptive lightening 120*a* is transmitted to the external server so that the server depicts all compatible test executions regarding software and hardware revision of test modules and test objects. The device may also transmit new combinations of test modules and test objects which are not present in a dataset. By way of example, if a test event on a test object is mapped by an unproved test module, the user can evaluate the new combination of test object and test module regarding errors resulting from the test execution. Hence, new interoperable combinations between test modules and test objects are considered which can be transmitted via the management interface to an external server. Using the device 100, the server can stay up to date and easily accessible by registered users planning to select suitable test modules for a pending test object.

The external entity 109 might be of any type for receiving, transmitting and/or saving interoperable combinations such as manual or electronic data consolidation which is available, retrievable, downloadable, callable, transferable, printable and much more such as it may be present on a server, in a list, a table, an excel sheet, an electronic document, a data program, an online or offline document, and much else. The external entity 109 sending information about interoperable combinations receivable by the management interface 106 may include data about inherent type of hardware and software, about type of interfaces, inherent drivers, updates, upgrades and in general all type of information relevant for efficient test execution between test modules of a modular test bench 110 and a test object 120*a* or 120*b*.

By way of example, signaling via interfaces such as input interface 101, output interface 105 or management interface 106 of the device 100 for the modular test bench 110 or a data interface 107 between test object and test module can be conventional via wire such as Universal Serial Bus (USB), Local Area Network (LAN) cable, optical fiber cable and much else or wireless alternatives such as wireless LAN (WLAN), Bluetooth, Near Field Communication (NFC) and much else. An example for the evaluation logic 104 may be any hardware or software operating a mathematical function mapping a relation of two sets wherein each element of one set is assigned to an element of the other set. In this example the two sets may be represented by the input comprising the first information 102 and the second information 103 via the input interface 101, the predetermined criterion via the management interface 106, and the output depending on the incoming parameters. Realization of the evaluation function 104 may comprise electronic components such as processors, transistors, diodes and much else.

Generally, the device 100 is not restricted to operate with information based on hardware and software revision of test modules 111*a*-111*c* and test objects 120*a* and 120*b*, respectively. The device 100 may alternatively also be configured to additionally operate with information based on data interface 107 and test events. Thus, another embodiment of the device 100 is considered for the modular test bench 110 with test modules 111*a*-111*c* testing the test object 120*a* or 120*b* wherein the input interface 101 is further configured to receive information on a revision of a data interface 107 between the test bench 110 and the test object 120 and information on a test event. In this event, the evaluation logic 104 may further be configured to determine if the combination of the revision of the data interface 107 and the information on a test event fulfills a further predetermined criterion. The output interface 105 is configured to output the check signal enabling the use of the test bench 110 if the revision of the data interface 107 and the information on a test event fulfills the further predetermined criterion. In the illustrated example, the vehicle 121 may be further tested regarding its brake assistant 120*b*. The brake assistant 120*b* can be tested via presenting the vehicle 121 a virtual simulation including test scenarios of the surrounding. The test scenario can contain different test events such as representing a fast-trafficked highway, a country road with landscape and much more. Thus, there may exist a variety of test events for testing the brake assistant 120*b*. Depending on the type of brake assistant 120*b*, certain test executions may be neglected as, e.g., the data interface 107 of the camera system controlling the brake assistant 120*b* is not able to receive and process all types of test events. An embodiment of the device 100 may be able to receive information on a test event via the input interface 101 and to determine if the data interface 107 of the camera system and the visualized test event fulfills a further predetermined criterion via the evaluation logic 104. As an example, the device 100 operates with three test events including a drive via a highway, a drive at night, and a drive through a play street. According to the predetermined criterion provided by an external server, the device 100 determines that the combination of the data interface 107 of the camera system of the brake assistant 120*b* is not compatible with some described test events. For example, certain test events might be not efficiently mappable to the camera system as the surrounding is too dark referring to the night drive or moving objects such as children are not detectable by the obsolete camera referring to the drive through a play street. Thus, the device 100 inhibits two incompatible test events for test object 120*b* reasonably by outputting a check signal via the output interface. Datasets can be additionally evaluated by an algorithm for further analysis. The analysis may provide information about functional validation between test bench module and test object. For example, functional validation may check whether the test bench module and/or test object works as intended or does not perform according to expectations. The application of the analysis algorithm on the dataset may serve as an additional method to identify compatible combinations between test bench module and test object according to specifications.

In general, the test bench may test a test object regarding functionality, comprising also that the test object works as it is specified. Datasets comprising interoperable combinations may also be used to find contradictions between and in the functionality of test objects. Contradictions may be for example incorrect implementation or also incorrect specification. On the one hand it can be considered that a hardware and/or software configuration of the test module does not match to the test object. On the other hand, it may be considered that test module and test object should never be compatible even not for updated test configurations.

For better understanding, the prescribed embodiments were related to automobile industry as an example for a mechatronic system comprising a variety of technical components each separately to be tested to grant a safety standard for the user of the end product. Generally, the device 100 can be used for all types of transportation such as e-bikes, motorbikes, quad bikes, trucks, planes, helicopter, unmanned aerial vehicle (UAV) and much more. Furthermore, the usage of the device 100 for modular test benches 111a-111c testing test objects 120a and 120b is not restricted in the field of transportation but also for all types of mechatronic systems or electric units. Just to name a few examples this may include fields containing and/or combining technical components to a complex object to be tested as it may be present in information technology, entertainment electronics, mobile phone industry, medical engineering, manufacturing engineering, logistical processes, driven tools, home appliances and much more.

Figure 2:
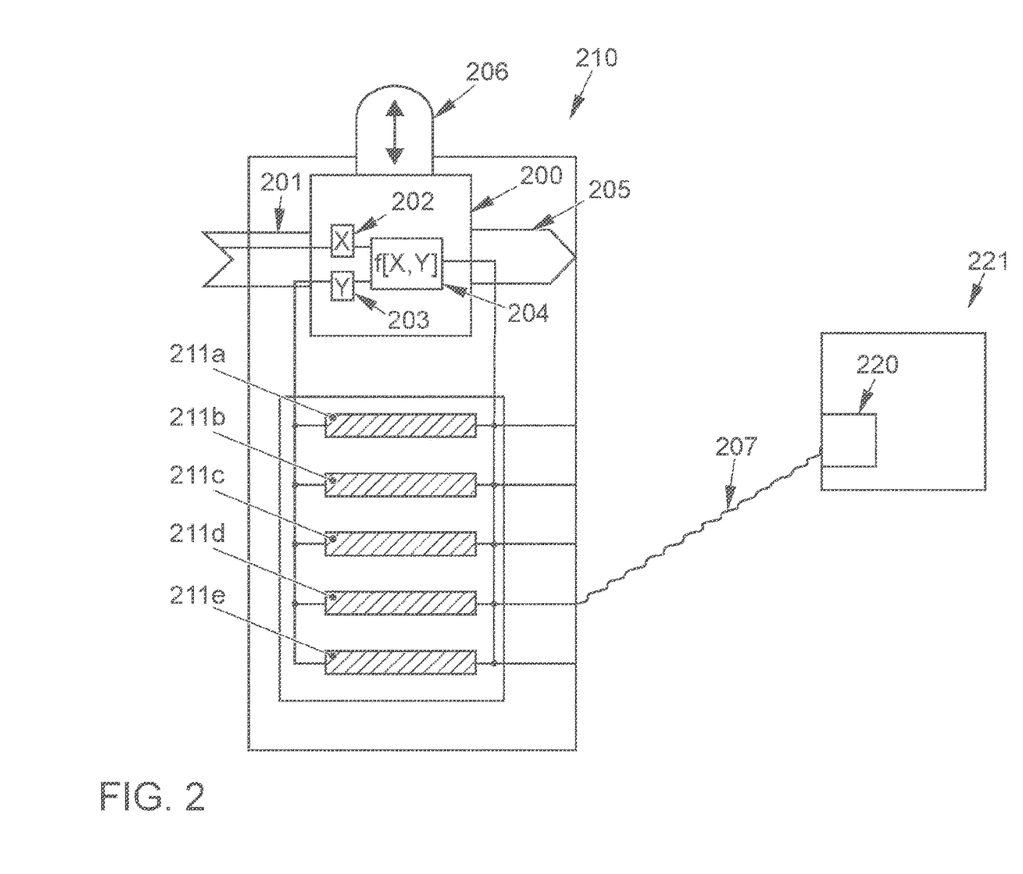
FIG. 2 illustrates an embodiment of a modular test bench.

FIG. 2 illustrates an embodiment of a modular test bench 210 for testing a test object 220 of a vehicle 221. The test bench 210 comprises a device 200, and a data interface 207 configured to connect to and transfer data to the test object 220. The device 210 comprises an input interface 201 configured to receive first information 202 on a hardware revision and on a software revision of test modules 211a-211e and second information on a hardware revision and on a software revision of the test object 220. The device 200 further comprises an evaluation logic 204 configured to determine if the combination of the first information 202 and the second information 203 fulfills a predetermined criterion. Further, the device 200 comprises an output interface 205 configured to output a check signal enabling the use of the test modules 211a- 211e if the combination of the first information 202 and the second information 203 fulfills a predetermined criterion. The discussed embodiment of the test bench 200 having implemented the device 200 as it is previously described in FIG. 1 , may be able to connect and transfer data to the test object 220 directly. As an example, prior to the usage of the test modules 211a-e for the test object 220, test execution according to compatible combinations of first information 202 and second information 203 is enabled or inhibited by the device 200 automatically. The test bench 210 including the device 200 stays up to date via the management interface 206 that receives and transmits interoperable combinations of first and second information form and to an external entity.

Figure 3:
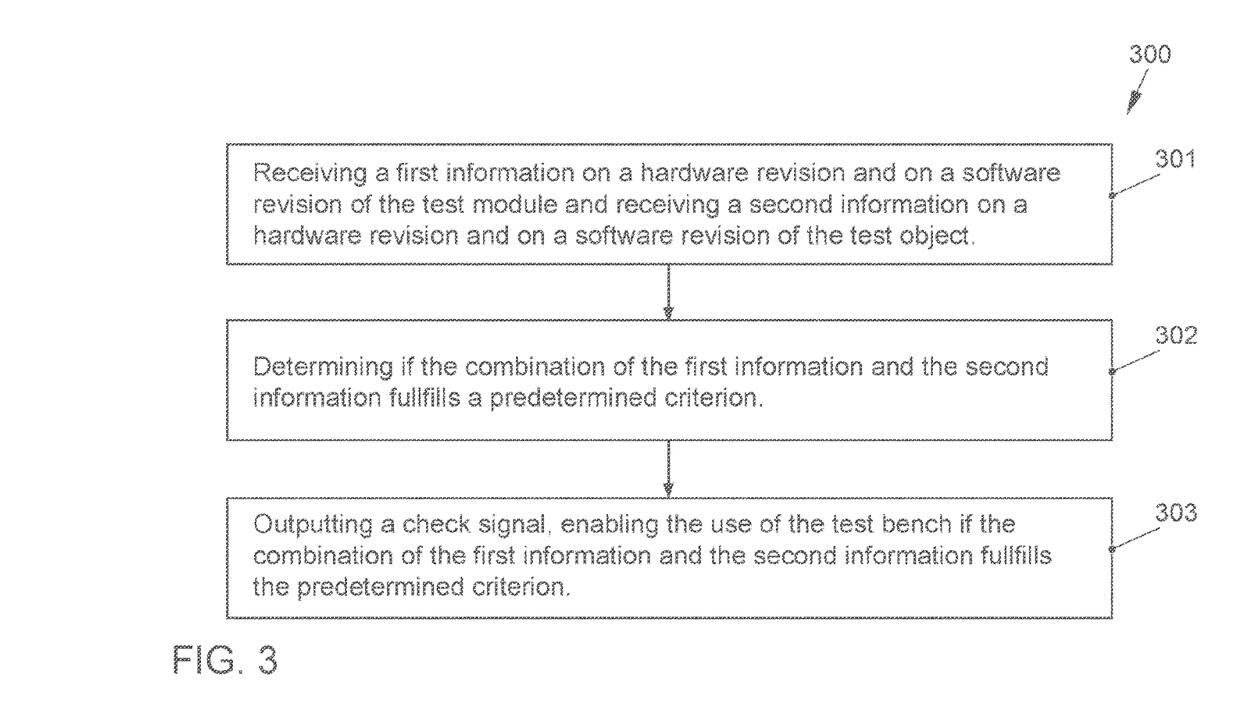
FIG. 3 illustrates a flowchart of an embodiment of a method for operating a modular test bench.

FIG. 3 shows a flow chart and illustrates an embodiment of a method for operating a modular test bench 300 wherein the modular test bench comprises at least one test module to test a test object. The method 300 comprises receiving first information on a hardware revision and on a software revision of the test module and receiving a second information on a hardware revision and on a software revision of the test object 301. The method 300 further comprises determining, if the combination of the first information and the second information fulfills a predetermined criterion 302 and outputting of a check signal, enabling the use of the test bench if the combination of the first information and the second information fulfills the predetermined criterion 303.

Another embodiment of the method may improve test benches and test infrastructure management by automatic configuration mapping of the test bench including cloud interface software. Further embodiments of the method may refer to a cloud-based test infrastructure and test bench management with automatic comparison between test configuration and test object requirements. A configuration mapping implementation scenario may be the construction of an embodiment of the device having an additional equipment or tool which can be plugged into modular test benches, e.g., to receive and/or store first information on hardware and software revision of test modules with or without regarding a predetermined criterion.

The predetermined criterion may have some specifications and is fulfilled if the hardware and software of the test bench is continuously adapted to the technology of the hardware and software of the test object which may be performed by updating or upgrading the configurations. This may require to continuously compare the test bench capabilities with those required by the test object. Thus, prior to continuous comparison between test bench capabilities and requirements of the test object, the definition of criteria relevant for comparison should be determined and also continuously reviewed.

In the event of car manufacturers, this may require standardizing those criteria throughout the car manufacturer's organization, train the personnel and to establish and maintain a strict test recipe versus test bench configuration.

As test benches often come from different vendors, test recipes versus test bench configurations increase and assuring compatibility, repeatability and reproducibility gets more and more difficult. Unfortunately, due to the typically proprietary implementation of Electronic Control Units (ECUs) in the automotive industry, corresponding test bench configurations often also are configured specifically to the needs of those ECUs. As a consequence, changes to hardware and software configurations to match also to other ECUs may negatively affect the test setup for the original specific purpose. The effort to test the test bench for readiness continues to a non-manageable level. As a result, a lot of test issues only pop up when the test object is already inserted in the test system. Besides the already mentioned issues to handle the complexity of test recipes to test bench configurations, another important problem does exist: First, new test recipes are no longer deterministic, but rather generated as a result of cloud-based simulations of drive environment and drive situation. These generated scenarios are interfaced to the test bench involving software that maps those scenarios to corresponding test bench configurations. Even if this software may follow an application programming interface (API), the exchange of data between a virtual test object or a virtual environment with the test module may require an extra transfer function to transform time stamps form the virtual world into real-time scenarios. Especially, here, limitations of some simulation capabilities may occur and may also remain. Therefore, this indicates the need to save corresponding test scenarios for real implemented hardware to avoid pseudo success or fail runs. The implementation of the software may be proprietary, only validated and verified for specific test bench hardware and software configurations. This software therefore needs always be reviewed with respect to their compatibility of the individual test bench configuration.

An embodiment of the device may transfer its configuration and assured test capabilities to a test infrastructure cloud. Further, with the availability of local and world-wide test bench information it may be possible to improve test infrastructure management and logistics by using an embodiment of the teachings herein. Test hardware and software gaps can be automatically visible as soon as the local test infrastructure is compared with the vehicle platform test requirements also stored in the cloud. Depending on the test bench hardware and software, a plug-and-play update configuration within an embodiment of a device may be possible simplifying a lot of work when test bench hardware is changed. Moreover, misuse may be prevented as a hardware change will indicate non-confirmed configurations by the device. Moreover, this allows a total traceability of test conditions, transfer to digital twins and homologation relevant reload capability after years. This may allow to simulate test configuration changes before implementation and might be beneficial for improved planning and issue solving.

Moreover, an embodiment of the device may provide a storage of test bench configuration in test modules to be integrated in each modular test bench. Furthermore, the released modular test bench configuration regarding the predetermined criterion can be stored. An embodiment of the device may also supply an automatic comparison between a present test bench configuration and released test bench configuration regarding the predetermined criterion and gives an indication of mismatch and incompatibility between test event, test module of a test bench and test object. An embodiment of the device may also store and control information in accordance with modular test bench configurations, to released test bench configurations regarding the predetermined criterion, and to automatic comparison of both within a test infrastructure cloud. An embodiment of the device may allow a possible usage of the Domain Computer Center (DCC) according to 2019/0592, K 26902 as important test bench element. By this means, automatic configuration mapping according to the principles as mentioned before will be much simplified for possible future test objects integrated into DCC according to 2019/0592, K 26902. By this implementation, synergies between test infrastructure and test object development may be created including virtual prototyping which may lead to cost savings.

The aspects and features mentioned and described together with one or more of the previously detailed examples and FIGS., may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the FIGS., including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods. It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

LIST OF REFERENCE NUMERALS

100 Device
101 Input interface

102 First information
103 Second information
104 Evaluation logic
105 Output interface
106 Management interface
107 Data interface
108 Memory
109 External entity
110 Modular test bench
111a-c Test modules
120a Test object: adaptive lightening
120b Test object: brake assistant
121 Vehicle
200 Device
201 Input interface
202 First information
203 Second information
204 Evaluation logic
205 Output interface
206 Management interface
207 Data interface
210 Modular test bench
211a-d Test modules
220 Test object
221 Vehicle
300 A method for operating a modular test bench, wherein the modular test bench comprises at least one test module to test a test object
301 Reception of a first information on a hardware revision and on a software revision of the test module and reception of a second information on a hardware revision and on a software revision of the test object
302 Determination, if the combination of the first information and the second information fulfills a predetermined criterion
303 Output of a check signal, enabling the use of the test bench if the combination of the first information and the second information fulfill the predetermined criterion The invention has been described in the preceding using various exemplary embodiments. Other variations to the disclosed embodiments may be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module or other unit or device may fulfil the functions of several items recited in the claims.

The term "exemplary" used throughout the specification means "serving as an example, instance, or exemplification" and does not mean "preferred" or "having advantages" over other embodiments. The terms "in particular" and "particularly" used throughout the specification means "for example" or "for instance".

The mere fact that certain measures are recited in mutually different dependent claims or embodiments does not indicate that a combination of these measures cannot be used to advantage. Any reference signs in the claims should not be construed as limiting the scope.

What is claimed is:

1. A method for operating a modular test bench, the modular test bench comprising at least one test bench circuit to test a test object, comprising:
    receiving a first information on a hardware revision and on a software revision of the test bench circuit, receiving a second information on a hardware revision and on a software revision of the test object, and receiving a third information on a test scenario to be performed by the modular test bench;
    determining, when a combination of the first information and the second information fulfills a first predetermined criterion; wherein
    the first predetermined criterion is fulfilled when the combination of the first information and the second information is present in a dataset comprising interoperable combinations between hardware revisions and software revisions of the test bench circuit and hardware revisions and software revisions of the test object;
    receiving fourth information on a revision of a data interface circuit between the test bench and the test object, wherein the third information comprises fifth information on a test event;
    determining, when a combination of the fourth information and the fifth information fulfills a second predetermined criterion; and
    outputting a check signal, enabling the use of the test bench when the combination of the first information and the second information fulfill the first predetermined criterion and the combination of fourth information and the fifth information fulfills the second predetermined criterion.

2. The method of claim 1, comprising: storing the dataset.

3. The method of claim 1, comprising:
    receiving and transmitting interoperable combinations of first information and second information from and to an external entity.

4. The method of claim 1, comprising:
    outputting the check signal inhibiting the use of the test bench when the combination of the first information and the second information does not fulfill the predetermined criterion.

5. The method of claim 1, wherein the test scenario comprises a plurality of test events and the test scenario is specific for the test object.

6. The method of claim 1, comprising:
    mapping the test scenario to a corresponding configuration of the modular test bench.

7. A device for a modular test bench, the modular test bench comprising at least one test bench circuit to test a test object, the device comprising:
    an input interface circuit configured to receive first information on a hardware revision and on a software revision of the test bench circuit, second information on a hardware revision and on a software revision of the test object, and third information on a test scenario to be performed by the modular test bench;
    an evaluation logic circuit configured to determine, when a combination of the first information and the second information fulfill a first predetermined criterion; wherein
    the first predetermined criterion is fulfilled [fif] when the combination of the first information and the second information is present in a dataset comprising interoperable combinations between hardware revisions and software revisions of the test bench circuit and hardware revisions and software revisions of the test object;
    wherein the input interface circuit is further configured to receive fourth information on a revision of a data interface circuit between the test bench and the test object;
    wherein the third information comprises fifth information on a test event;

wherein the evaluation logic circuit is further configured to determine, when a combination of the fourth information and the fifth information fulfills a second predetermined criterion; and an output interface circuit configured to output a check signal, enabling the use of the test bench when the combination of the first information and the second information fulfill the first predetermined criterion and the combination of fourth information and the fifth information fulfills the second predetermined criterion.

8. The device of claim 7, comprising:
a memory having stored therein the dataset.

9. The device of claim 7, comprising:
a management interface circuit configured to receive and transmit interoperable combinations of first information and second information from and to an external entity.

10. The device of claim 7, wherein the output interface circuit is further configured to output a check signal inhibiting the use of the test bench when the combination of the first information and the second information do not fulfill the predetermined criterion.

11. A modular test bench, comprising:
a device of claim 7; and
a data interface circuit configured to connect to and transfer data to the test object.

12. The modular test bench of claim 11, wherein the data interface circuit is further configured to connect to a vehicle.

13. A non-transitory storage medium with a computer program having program code for, when executed on a programmable processor, performing:
receiving a first information on a hardware revision and on a software revision of a test bench circuit, receiving a second information on a hardware revision and on a software revision of a test object, and receiving a third information on a test scenario to be performed by a modular test bench;

determining, when a combination of the first information and the second information fulfills a first predetermined criterion; wherein the first predetermined criterion is fulfilled when the combination of the first information and the second information is present in a dataset comprising interoperable combinations between hardware revisions and software revisions of the test bench circuit and hardware revisions and software revisions of the test object;

receiving fourth information on a revision of a data interface circuit between the test bench and the test object, wherein the third information comprises fifth information on a test event;

determining, when a combination of the fourth information and the fifth information fulfills a second predetermined criterion; and outputting a check signal, enabling the use of the test bench when the combination of the first information and the second information fulfill the first predetermined criterion and the combination of fourth information and the fifth information fulfills the second predetermined criterion.

14. The non-transitory storage medium of claim 13, comprising:
receiving and transmitting interoperable combinations of first information and second information from and to an external entity.

15. The method f elaun I non-transitory storage medium of claim 13, comprising:
outputting the check signal inhibiting the use of the test bench when the combination of the first information and the second information does not fulfill the predetermined criterion.

* * * * *